(12) United States Patent
Kitahama

(10) Patent No.: US 11,276,801 B2
(45) Date of Patent: Mar. 15, 2022

(54) LIGHT-EMITTING ELEMENT

(71) Applicant: NICHIA CORPORATION, Anan (JP)

(72) Inventor: Shun Kitahama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 119 days.

(21) Appl. No.: 16/808,577

(22) Filed: Mar. 4, 2020

(65) Prior Publication Data
US 2020/0321492 A1 Oct. 8, 2020

(30) Foreign Application Priority Data

Apr. 2, 2019 (JP) .............................. JP2019-070455

(51) Int. Cl.
*H01L 33/40* (2010.01)
*H01L 33/42* (2010.01)
*H01L 33/38* (2010.01)

(52) U.S. Cl.
CPC .......... *H01L 33/405* (2013.01); *H01L 33/382* (2013.01); *H01L 33/42* (2013.01)

(58) Field of Classification Search
CPC ...... H01L 33/405; H01L 33/382; H01L 33/42
See application file for complete search history.

(56) References Cited

U.S. PATENT DOCUMENTS

| 8,987,772 | B2* | 3/2015 | Kim | ........................ H01L 33/36 257/99 |
| 9,484,500 | B2 | 11/2016 | Kim et al. | |
| 9,653,515 | B2* | 5/2017 | Yoon | ........................ H01L 27/15 |
| 10,505,076 | B2* | 12/2019 | Chou | ..................... H01L 33/145 |
| 10,720,412 | B2* | 7/2020 | Hayashi | .............. H01L 25/0753 |
| 2011/0163346 | A1* | 7/2011 | Seo | .......................... H01L 33/42 257/99 |
| 2012/0085988 | A1* | 4/2012 | Yu | .......................... H01L 33/38 257/13 |
| 2015/0349209 | A1 | 12/2015 | Nagamatsu et al. | |
| 2016/0020363 | A1 | 1/2016 | Kitahama et al. | |
| 2016/0240757 | A1 | 8/2016 | Daikoku et al. | |

(Continued)

FOREIGN PATENT DOCUMENTS

| CN | 108231971 A | 6/2018 |
| JP | 2015-225915 A | 12/2015 |

(Continued)

*Primary Examiner* — Eugene Lee
(74) *Attorney, Agent, or Firm* — Foley & Lardner LLP

(57) ABSTRACT

A light-emitting element includes: a semiconductor stacked body; an insulating film located on a p-type semiconductor layer; a p-side electrode located on the insulating film, the p-side electrode comprising a pad portion and an extension portion, the extension portion being continuous with the pad portion in a first direction; a light-transmissive conductive film located on the p-type semiconductor layer and on the insulating film, the light-transmissive conductive film having an opening that is continuous along the extension portion on the insulating film; and a reflective film located between the insulating film and the p-side electrode in the opening. The opening includes a first opening and a second opening. In the second direction, the light-transmissive conductive film is electrically connected to the extension portion of the p-side electrode at a portion adjacent to a region where the first opening is located.

20 Claims, 8 Drawing Sheets

(56) References Cited

U.S. PATENT DOCUMENTS

| | | | |
|---|---|---|---|
| 2017/0117442 A1* | 4/2017 | Sato | H01L 33/06 |
| 2017/0263818 A1* | 9/2017 | Ou | H01L 33/36 |
| 2018/0138370 A1* | 5/2018 | Shin | H01L 33/42 |
| 2018/0198023 A1 | 7/2018 | Kim et al. | |

FOREIGN PATENT DOCUMENTS

| | | |
|---|---|---|
| JP | 2016-025213 A | 2/2016 |
| JP | 2016-149476 A | 8/2016 |
| JP | 2018-113442 A | 7/2018 |

\* cited by examiner

FIG. 7
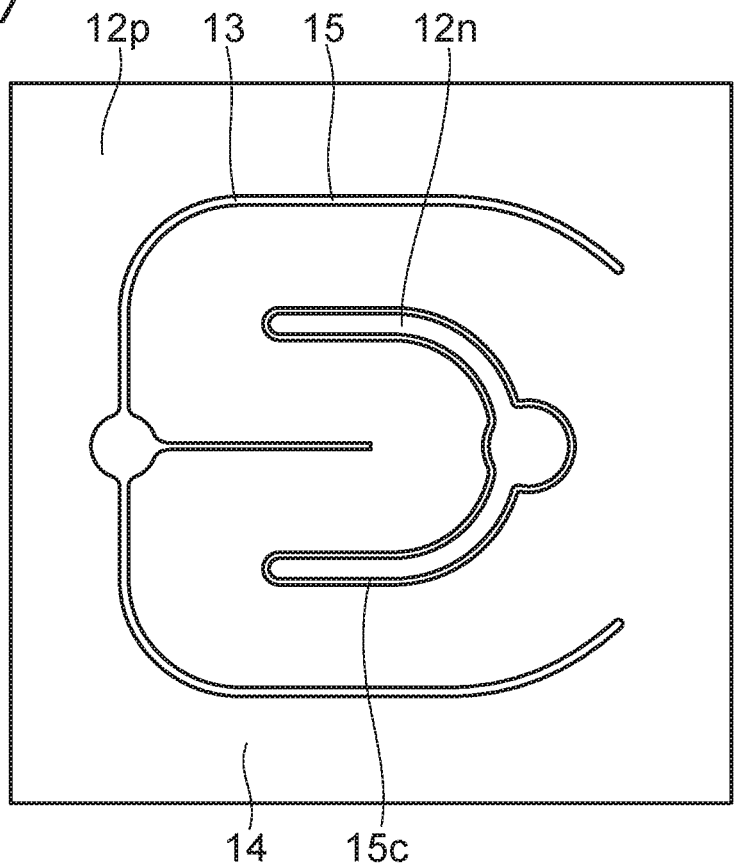
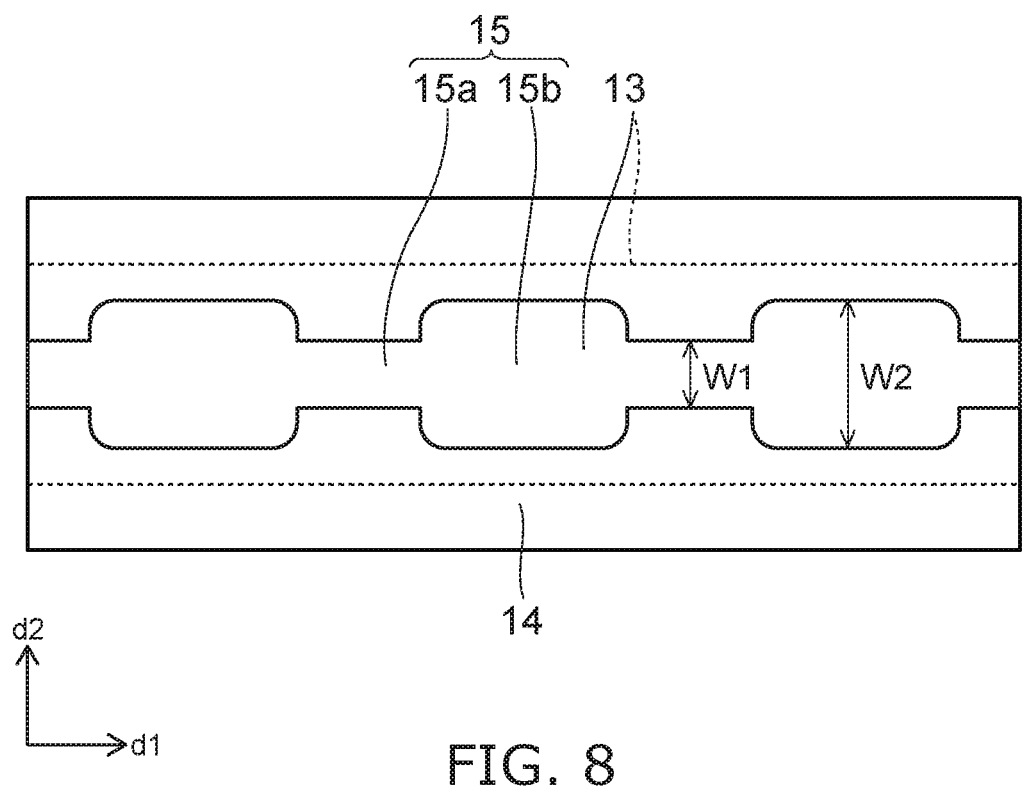
FIG. 8

LIGHT-EMITTING ELEMENT

CROSS-REFERENCE TO RELATED APPLICATION

This application claims priority to Japanese Patent Application No. 2019-070455, filed on Apr. 2, 2019, the contents of which are hereby incorporated by reference in their entirety.

BACKGROUND

The present disclosure relates to a light-emitting element.

In one configuration of a known light-emitting element, current is diffused to a wide area of a semiconductor layer by forming a light-transmissive conductive film to contact an upper portion of a metal electrode disposed at a light extraction surface of the light-emitting element. The metal electrode and the light-transmissive conductive film may cause the light extraction efficiency to decrease due to absorption of the light. Therefore, for example, in Japanese Patent Publication No. 2018-113442, a structure is proposed in which an insulating film such as $SiO_2$ or the like having a lower refractive index than the light-transmissive conductive film is provided between the light-transmissive conductive film and the semiconductor layer in a region directly under the metal electrode, and a structure is proposed in which a reflective film of Al or the like is provided below the metal electrode. However, it is desirable to increase the light extraction efficiency further.

SUMMARY

According to certain embodiments of the present disclosure, a light-emitting element is provided in which light extraction efficiency can be increased.

According to one embodiment, a light-emitting element includes a semiconductor stacked body including an n-type semiconductor layer, a light-emitting layer provided on the n-type semiconductor layer, and a p-type semiconductor layer provided on the light-emitting layer; an insulating film provided on the p-type semiconductor layer; a p-side electrode provided on the insulating film, the p-side electrode including a pad portion and an extension portion, the extension portion being continuous with the pad portion in a first direction; a light-transmissive conductive film provided on the p-type semiconductor layer and on the insulating film, the light-transmissive conductive film having an opening provided to be continuous along the extension portion of the p-side electrode on the insulating film; and a reflective film provided between the insulating film and the p-side electrode in the opening of the light-transmissive conductive film. The opening of the light-transmissive conductive film includes a first opening and a second opening. A width of the first opening is less than a width of the second opening in a second direction orthogonal to the first direction. A width of the extension portion of the p-side electrode is less than the width of the second opening in the second direction. In the second direction, the light-transmissive conductive film is electrically connected to the extension portion of the p-side electrode at a portion adjacent to a region where the first opening is provided.

Certain embodiments of the present disclosure can provide a light-emitting element in which the light extraction efficiency can be increased.

BRIEF DESCRIPTION OF THE DRAWINGS

FIG. 7 is a schematic top view in which a light-transmissive conductive film is added to the configuration shown in FIG. 6;

FIG. 8 is a schematic top view showing an opening of the light-transmissive conductive film in the portion shown in FIG. 2;

DETAILED DESCRIPTION

Figure 1A:
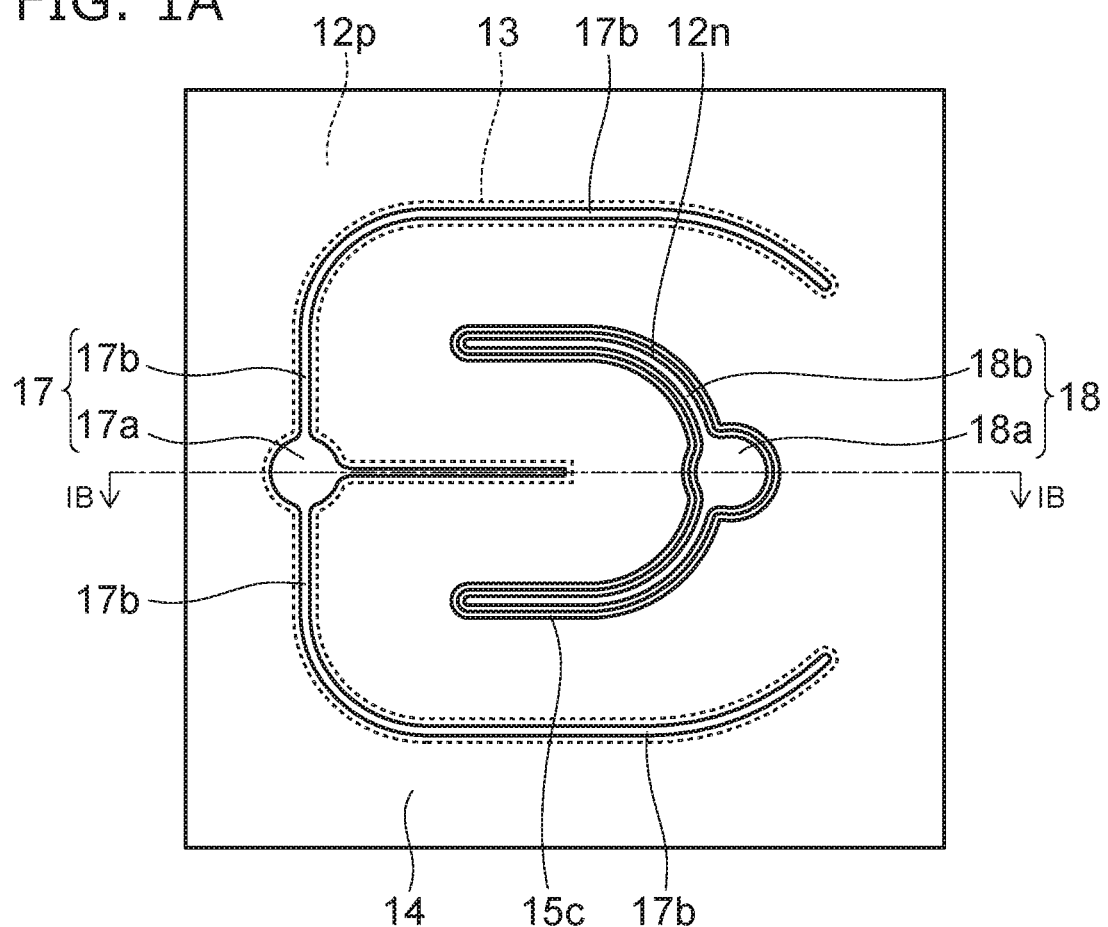
FIG. 1A is a schematic top view of a light-emitting element of an embodiment of the invention.

Embodiments will now be described with reference to the drawings. The same components in the drawings are marked with the same reference numerals.

Figure 1B:
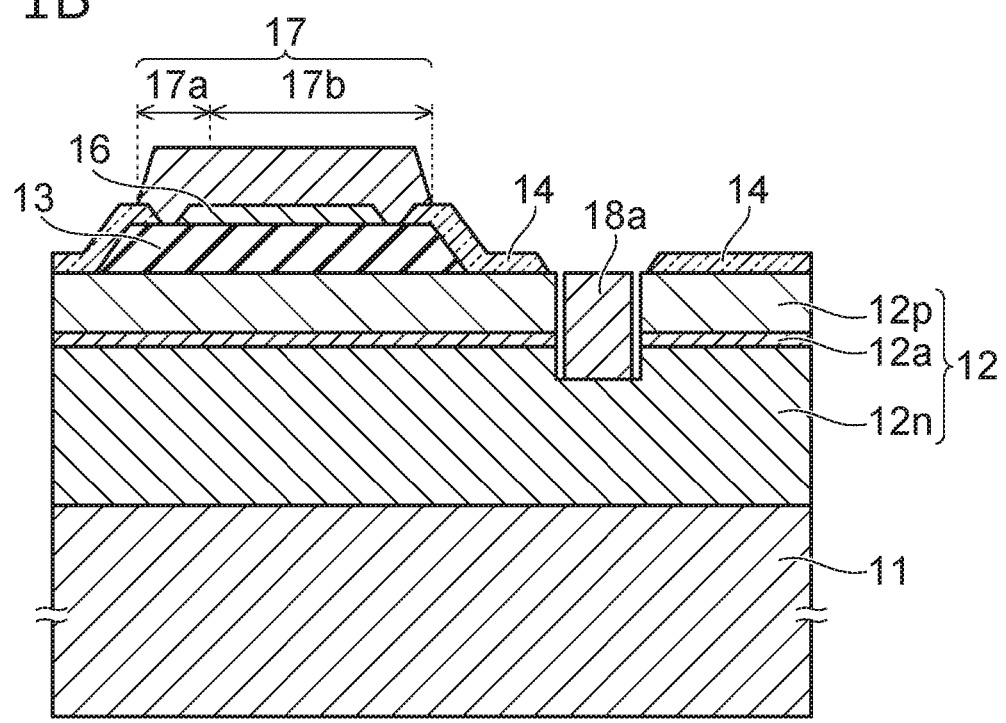
FIG. 1B is a schematic cross-sectional view along line IB-IB of FIG. 1A.

FIG. 1A is a schematic top view of a light-emitting element according to an embodiment of the invention. FIG. 1B is a schematic cross-sectional view along line IB-IB of FIG. 1A.

The light-emitting element of the present embodiment is, for example, a face-up light-emitting element in which the light extraction surface is the surface on the p-type semiconductor layer side of a semiconductor stacked body in which an n-type semiconductor layer, a light-emitting layer (an active layer), and a p-type semiconductor layer are stacked. FIG. 1A is the top view of the light extraction surface of the light-emitting element.

A p-side electrode 17 and an n-side electrode 18 are disposed at the light extraction surface. The p-side electrode 17 includes a pad portion 17a and an extension portion 17b. The n-side electrode 18 includes a pad portion 18a and an extension portion 18b. Wires are bonded respectively to the pad portion 17a and the pad portion 18a. The p-side electrode 17 and the n-side electrode 18 are electrically connected to an external circuit via the wires.

In the p-side electrode 17, for example, multiple extension portions 17b are continuous with one pad portion 17a in a first direction. The direction in which any extension portion 17b extends is the first direction. For example, in a top-view shown in FIG. 1A, the first direction may be the left/right direction, the vertical direction, or an oblique direction. Similarly, in the n-side electrode 18, for example, multiple extension portions 18b are continuous with one pad portion 18a. In the light-emitting element of the embodiment shown in FIG. 1A, the p-side electrode 17 includes one pad portion 17a and three extension portions 17b. The n-side electrode 18 includes one pad electrode 18a and two extension portions 18b. One extension portion 17b extends toward the pad portion 18a of the n-side electrode 18. The other two extension portions 17b extend toward the pad electrode 18a side of the n-side electrode 18 outside the two extension portions 18b of the n-side electrode 18, and are disposed to surround the n-side electrode 18. The extension portions 17b of the p-side electrode 17 and the extension portions 18b of the n-side electrode 18 include portions parallel to each other.

Figure 2:
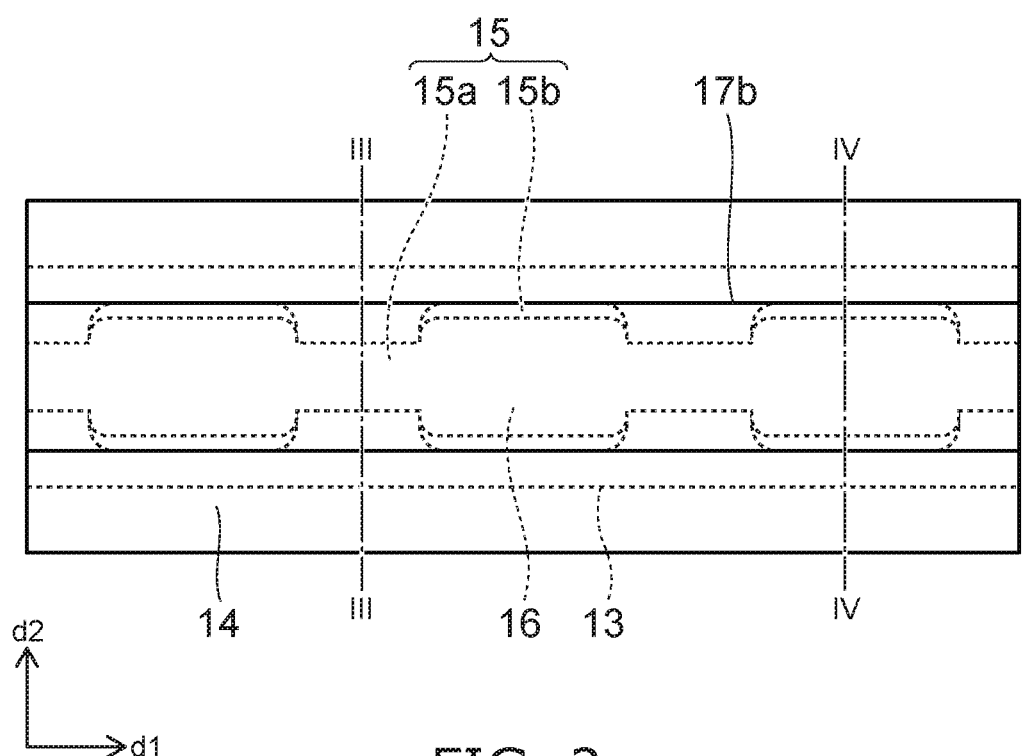
FIG. 2 is an enlarged schematic top view of a portion of the light-emitting element of the embodiment of the invention where an extension portion of a p-side electrode is disposed.

FIG. 2 is an enlarged schematic top view of a portion of the light-emitting element shown in FIG. 1A where the extension portion 17b of the p-side electrode 17 is disposed. The left/right direction in FIG. 2 is a first direction d1 in which the extension portion 17b extends.

Figure 3:
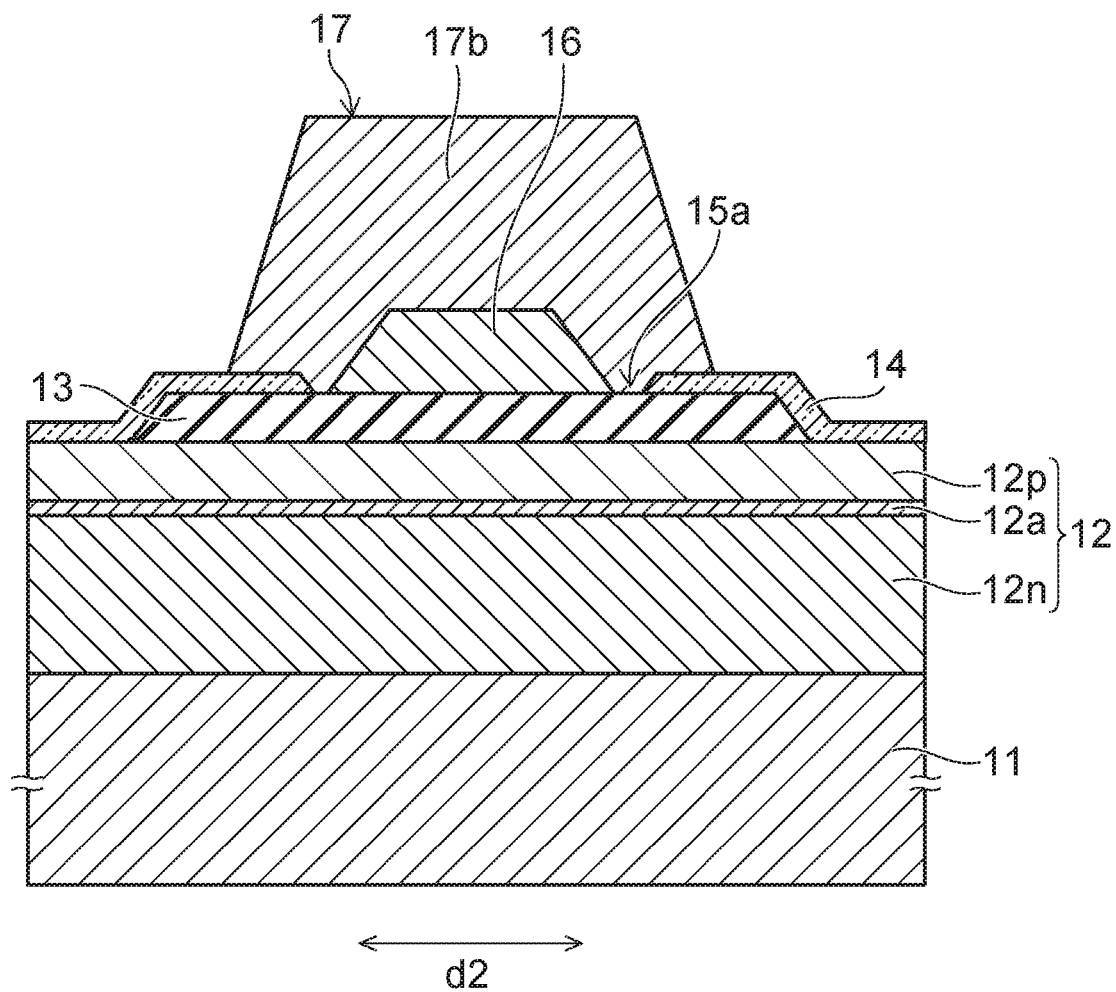
FIG. 3 is a schematic cross-sectional view along line of FIG. 2.

FIG. 3 is a schematic cross-sectional view along line of FIG. 2.

Figure 4:
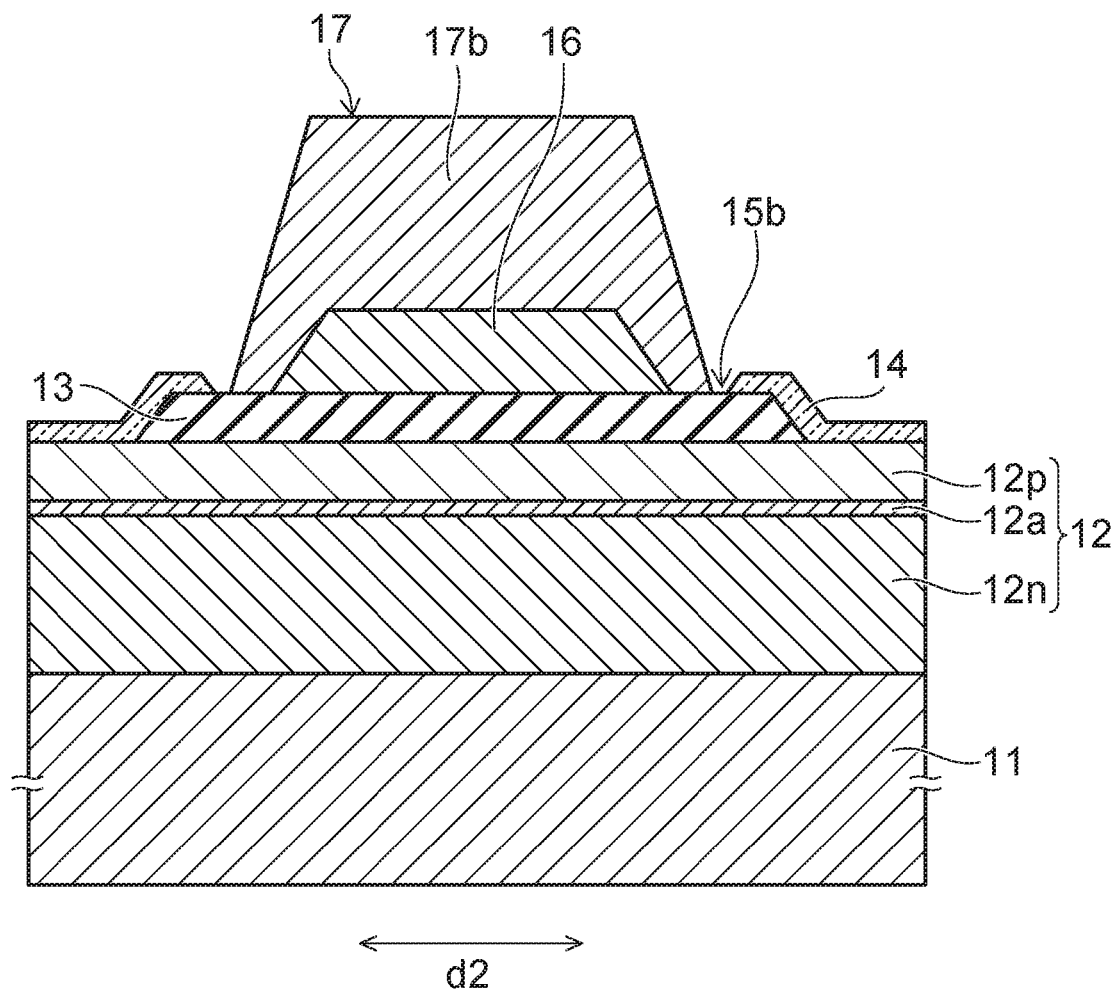
FIG. 4 is a schematic cross-sectional view along line IV-IV of FIG. 2.

FIG. 4 is a schematic cross-sectional view along line IV-IV of FIG. 2.

As shown in FIG. 1B, FIG. 3, and FIG. 4, the light-emitting element includes a semiconductor stacked body 12. The semiconductor stacked body 12 includes, for example, a Group III-V compound semiconductor. The semiconductor stacked body 12 includes, for example, GaN, GaAs, AlGaN, InGaN, AlInGaP, GaP, SiC, ZnO, etc.

As shown in FIG. 1B and FIG. 3, the semiconductor stacked body 12 includes an n-type semiconductor layer 12n, a p-type semiconductor layer 12p, and a light-emitting layer (an active layer) 12a provided between the n-type semiconductor layer 12n and the p-type semiconductor layer 12p. The n-type semiconductor layer 12n is provided on a substrate 11, the light-emitting layer 12a is provided on the n-type semiconductor layer 12n, and the p-type semiconductor layer 12p is provided on the light-emitting layer 12a.

For example, the semiconductor stacked body 12 is epitaxially grown on the substrate 11. The material of the substrate 11 is, for example, sapphire, silicon, SiC, GaAs, diamond, etc.

Figure 5:
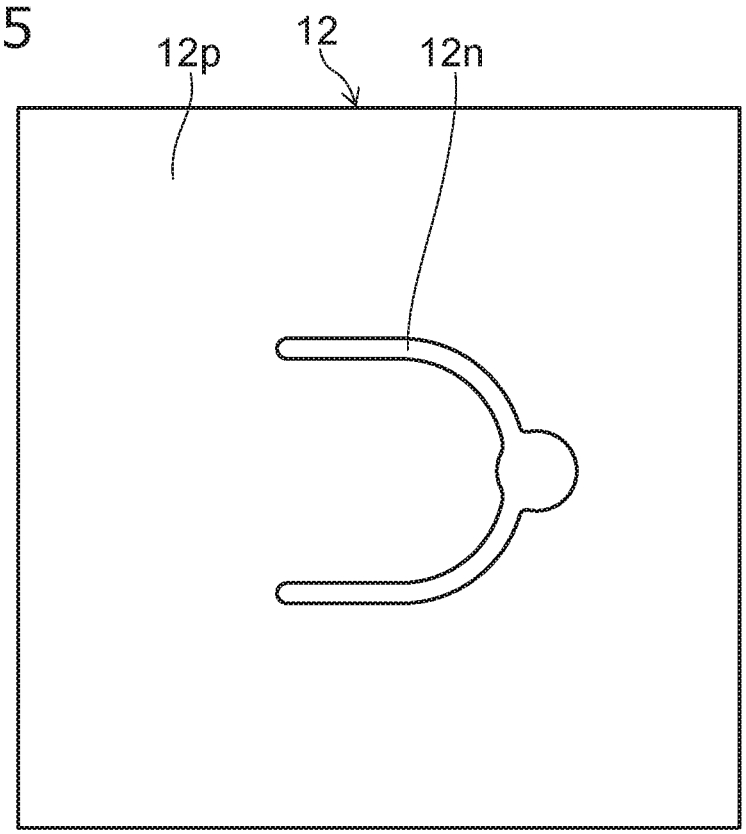
FIG. 5 is a schematic top view of a semiconductor stacked body of the light-emitting element of the embodiment of the invention.

FIG. 5 is a schematic top view of the semiconductor stacked body 12.

In the semiconductor stacked body 12 as shown in FIG. 1B, a portion of the n-type semiconductor layer 12n is exposed from the p-type semiconductor layer 12p and the light-emitting layer 12a by removing a portion of the p-type semiconductor layer 12p and a portion of the light-emitting layer 12a. That is, there is a portion where the light-emitting layer 12a and the p-type semiconductor layer 12p are not provided on the n-type semiconductor layer 12n. The n-side electrode 18 shown in FIG. 1A is provided at a portion of the exposed n-type semiconductor layer 12n. The n-side electrode 18 contacts a portion of the n-type semiconductor layer 12n and is electrically connected to the n-type semiconductor layer 12n. The light-emitting layer 12a has a light emission peak wavelength of, for example, not less than about 430 nm and not more than about 540 nm, and emits blue light and/or green light.

As shown in FIG. 3 and FIG. 4, an insulating film 13 is provided between the p-type semiconductor layer 12p and the p-side electrode 17.

Figure 6:
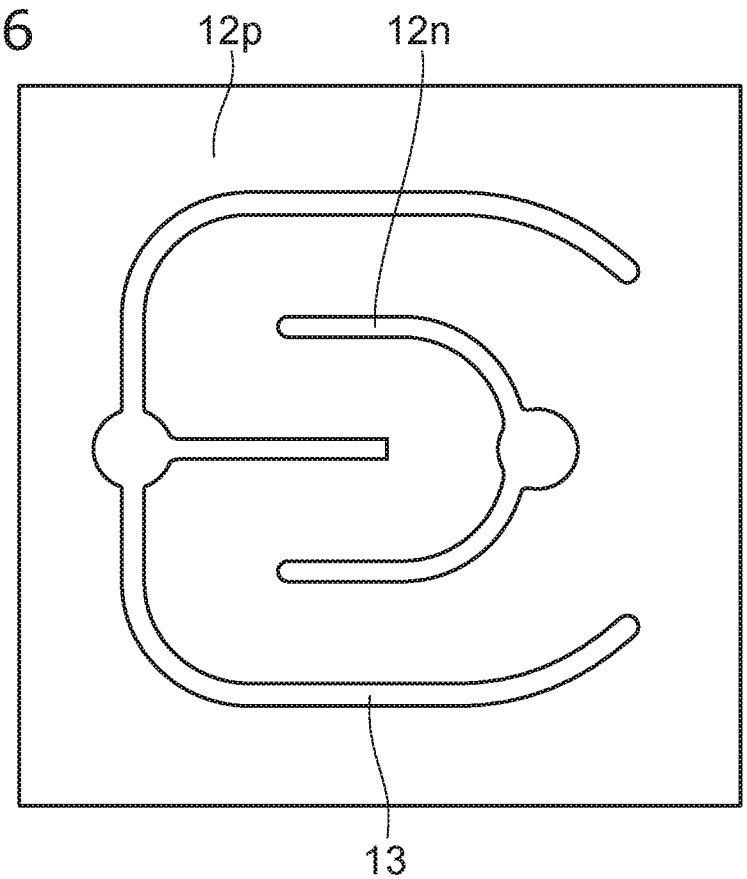
FIG. 6 is a schematic top view in which an insulating film is added to the configuration shown in FIG. 5.

FIG. 6 is a schematic top view in which the insulating film 13 is added to the configuration shown in FIG. 5.

In a top-view, the insulating film 13 is formed in the region where the p-side electrode 17 shown in FIG. 1A is provided. In a top-view, the p-side electrode 17 is provided inside the region where the insulating film 13 is provided. As shown in FIG. 3 and FIG. 4, the p-side electrode 17 is provided on the insulating film 13 with a reflective film 16 interposed. A direction orthogonal to the first direction, which is the extension direction of the extension portion 17b of the p-side electrode 17, is taken as a second direction d2. The width in the second direction d2 of the insulating film 13 is greater than the width in the second direction d2 of the extension portion 17b of the p-side electrode 17. The width in the second direction d2 of each member is the shortest distance from one end portion to another end portion in the second direction d2.

A light-transmissive conductive film 14 is provided on substantially the entire surface of the upper surface of the p-type semiconductor layer 12p. The light-transmissive conductive film 14 is also provided on the insulating film 13. The light-transmissive conductive film 14 has an opening 15 such as that shown in FIG. 2 on the insulating film 13.

FIG. 7 is a schematic top view in which the light-transmissive conductive film 14 is added to the configuration shown in FIG. 6.

FIG. 8 is a schematic top view showing the opening 15 of the light-transmissive conductive film 14 in the portion shown in FIG. 2.

The opening 15 of the light-transmissive conductive film 14 is continuous along the extension portion 17b of the p-side electrode 17. A portion of the insulating film 13 is exposed in the opening 15. As shown in FIG. 7, a third opening 15c that exposes the portion of the n-type semiconductor layer 12n in contact with the n-side electrode 18 also is formed in the light-transmissive conductive film 14. In a top-view, the third opening 15c is formed in substantially the same configuration as the portion of the n-type semiconductor layer 12n where the light-emitting layer 12a and the p-type semiconductor layer 12p are not provided.

As shown in FIG. 8, the opening 15 include first openings 15a and second openings 15b on the insulating film 13. A width W1 in the second direction d2 of the first opening 15a is less than a width W2 in the second direction d2 of the second opening 15b. For example, the first opening 15a and the second opening 15b are provided alternately along the first direction d1.

FIG. 3 is a schematic cross-sectional view along line of FIG. 2. FIG. 3 is a cross-sectional view along the second direction of the region where the first opening 15a is provided.

FIG. 4 is a cross-sectional view along line IV-IV of FIG. 2. FIG. 4 is a cross-sectional view along the second direction of the region where the second opening 15b is provided.

The extension portion 17b of the p-side electrode 17 and the light-transmissive conductive film 14 provided on the insulating film 13 where the first opening 15a is provided are in contact in the second direction as shown in FIG. 3. The light-transmissive conductive film 14 that is provided to be adjacent in the second direction (the left/right direction in FIG. 3) to the region of the light-transmissive conductive film 14 where the first opening 15a is provided is electrically connected to the extension portion 17b of the p-side electrode 17. The extension portion 17b of the p-side electrode 17 is electrically connected to the light-transmissive conductive film 14 provided to be adjacent in the second direction to the two sides of the region of the light-transmissive conductive film 14 where the first opening 15a is provided.

The light-transmissive conductive film 14 contacts the upper surface of the p-type semiconductor layer 12p in a region where the insulating film 13 is not provided. The p-side electrode 17 is provided at a portion of the upper surface of the light-transmissive conductive film 14. The p-side electrode 17 is electrically connected to the p-type semiconductor layer 12p via the light-transmissive conductive film 14. The light-transmissive conductive film 14 functions as a current diffusion layer diffusing, in the surface direction of the p-type semiconductor layer 12p, a current supplied from the outside via the p-side electrode 17.

In the region directly under the p-side electrode 17 as shown in FIGS. 3 and 4, the insulating film 13 is provided between the p-type semiconductor layer 12p and the light-transmissive conductive film 14 and between the p-type semiconductor layer 12p and the p-side electrode 17. Thereby, the current concentration toward the p-type semiconductor layer 12p in the region directly under the p-side electrode 17 can be suppressed, and the fluctuation of the luminance distribution in the light extraction surface can be suppressed by the current diffusion effect of the light-transmissive conductive film 14 described above.

The light-transmissive conductive film 14 is transmissive to the wavelength of the light emitted by the light-emitting layer 12a. The light-transmissive conductive film 14 is, for example, a conductive metal-oxide film. For example, an oxide including at least one type of element selected from the group consisting of Zn, In, Sn, Ga, and Ti is an example of such a conductive metal-oxide film. For example, the material of the light-transmissive conductive film 14 is ITO (Indium Tin Oxide). The thickness of the light-transmissive conductive film 14 is, for example, not less than 10 nm and not more than 200 nm.

The insulating film 13 also is transmissive to the wavelength of the light emitted by the light-emitting layer 12a. For example, the insulating film 13 is a silicon oxide film. It is favorable for the refractive index of the insulating film 13 for the wavelength of the light emitted by the light-emitting layer 12a to be lower than the refractive index of the light-transmissive conductive film 14 for the wavelength of the light emitted by the light-emitting layer 12a. The thickness of the insulating film 13 is, for example, not less than 100 nm and not more than 1000 nm.

As shown in FIG. 4, the extension portion 17b of the p-side electrode 17 and the light-transmissive conductive film 14 provided on the insulating film 13 where the second opening 15b is provided are not in contact in the second direction.

Figure 9:
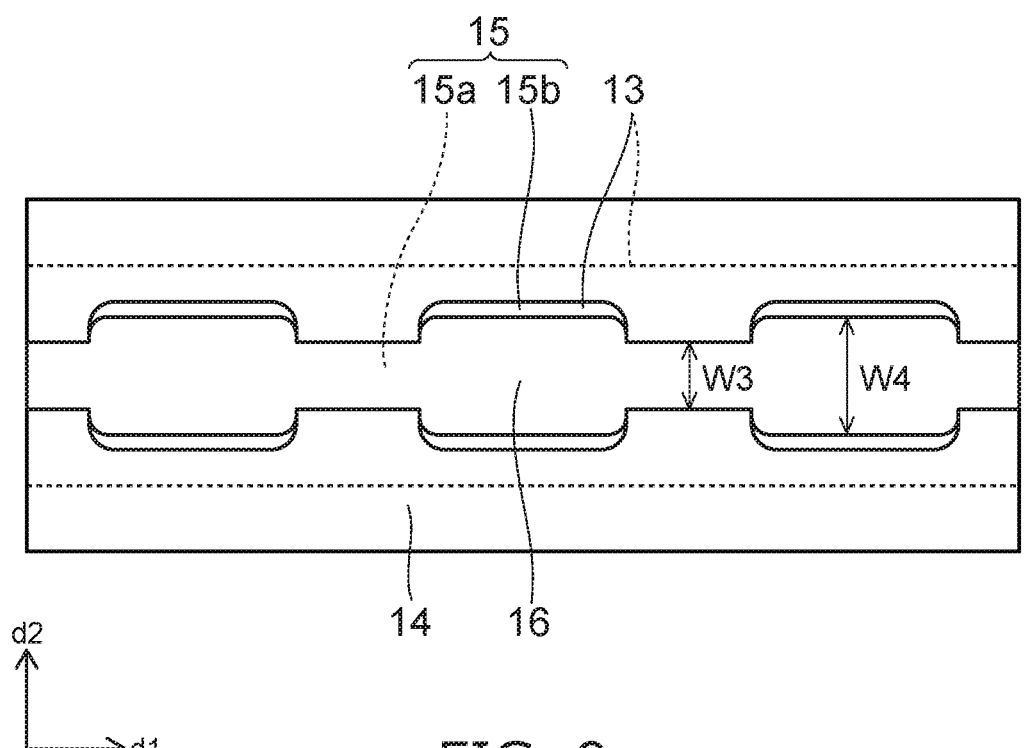
FIG. 9 is a schematic top view in which a reflective film is added to the configuration shown in FIG. 8.

FIG. 9 is a schematic top view in which the reflective film 16 is added to the configuration shown in FIG. 8.

As shown in FIG. 9, the reflective film 16 is provided on the insulating film 13 exposed in the opening 15 of the light-transmissive conductive film 14. A width W4 in the second direction d2 of the reflective film 16 provided in the second opening 15b is greater than a width W3 in the second direction d2 of the reflective film 16 provided in the first opening 15a. The width W4 in the second direction d2 of the reflective film 16 is the same as or less than the width W2 in the second direction d2 of the second opening 15b. The width W3 in the second direction d2 of the reflective film 16 is the same as or less than the width W1 in the second direction d2 of the first opening 15a.

As shown in FIG. 3 and FIG. 4, the reflective film 16 is provided on the insulating film 13 in the first opening 15a and the second opening 15b of the light-transmissive conductive film 14. The p-side electrode 17 covers the upper surface and the side surface of the reflective film 16. The p-side electrode 17 is provided also at the upper surface of the light-transmissive conductive film 14.

The material of the p-side electrode 17 is a metal material (also including alloys) and includes, for example, at least one of Cu or Au as a major component. The thickness of the p-side electrode 17 is, for example, not less than 1 μm and not more than 3 μm. The reflectance of the reflective film 16 to the wavelength of the light emitted by the light-emitting layer 12a is higher than the reflectance of the p-side electrode 17 to the wavelength of the light emitted by the light-emitting layer 12a. The reflective film 16 includes, for example, at least one type of element selected from the group consisting of Al, Ru, Ag, Ti, and Ni. The reflective film 16 is, for example, an Al film or an Al alloy film. The thickness of the reflective film 16 is, for example, not less than 30 nm and not more than 500 nm.

Because the p-side electrode 17 is a metal member that is light-shielding or absorptive to the wavelength of the light emitted by the light-emitting layer 12a, the light is not easily extracted from the region of the light extraction surface where the p-side electrode 17 is disposed. As a result, the light extraction efficiency can be increased by increasing the reflectance of the p-side electrode 17 and reducing the optical absorption due to the p-side electrode 17.

According to the light-emitting element of the present embodiment, the surface area of the light-transmissive conductive film 14 provided on the insulating film 13 can be reduced by forming the opening 15 of the light-transmissive conductive film 14 while setting the connection portion with the p-side electrode 17 to remain. Thus, the proportion of the light absorbed by the light-transmissive conductive film 14 can be reduced by reducing the surface area of the light-transmissive conductive film 14.

The light that propagates from the semiconductor stacked body 12 toward the p-side electrode 17 is reflected at the reflective film 16 and/or the interface between the semiconductor stacked body 12 and the insulating film 13 and returns into the semiconductor stacked body 12. Then, the light is reflected inside the semiconductor stacked body 12 and is extracted outside the semiconductor stacked body 12 by passing through the light-transmissive conductive film 14 provided in the region where the p-side electrode 17 is not disposed.

As shown in FIG. 4, the width in the second direction of the second opening 15b formed in the light-transmissive conductive film 14 in the region where the light-transmissive conductive film 14 and the extension portion 17b of the p-side electrode 17 are not connected is set to be greater than the width in the second direction of the first opening 15a shown in FIG. 3. Thereby, the surface area of the light-transmissive conductive film 14 in the region directly under the extension portion 17b can be reduced, and the surface area (the width in the second direction) of the reflective film 16 provided on the insulating film 13 can be greater than the surface area of the reflective film 16 provided in the first opening 15a. As a result, the reflecting region due to the reflective film 16 can be increased while suppressing the optical absorption due to the light-transmissive conductive film 14, and the light extraction efficiency can be increased. In the region where the extension portion 17b and the light-transmissive conductive film 14 are not connected, the reflecting region due to the reflective film 16 may be increased by widening the width of the reflective film 16 so that a portion of the reflective film 16 is positioned on the light-transmissive conductive film 14 on the insulating film 13.

In the case in which the reflective film 16 includes Al and the light-transmissive conductive film 14 includes ITO, the contact resistance between the reflective film 16 and the light-transmissive conductive film 14 is higher than the contact resistance between the ITO and the material of the p-side electrode 17 (e.g., Cu and Au). Accordingly, in the case in which the light-transmissive conductive film 14 includes ITO or the reflective film 16 includes Al, a portion of the reflective film 16 is disposed not to be positioned on the light-transmissive conductive film 14 in the region where the extension portion 17b of the p-side electrode 17 and the light-transmissive conductive film 14 provided to be adjacent to the first opening 15a are connected as shown in FIG. 3. Such an arrangement is favorable because the contact area between the p-side electrode 17 and the light-transmissive conductive film 14 is larger than that of the case in which a portion of the reflective film 16 is positioned on the light-transmissive conductive film 14.

In both the region where the first opening 15a is formed and the region where the second opening 15b is formed, the upper surface and the side surface of the reflective film 16 are covered with and protected by the p-side electrode 17 that includes, for example, Cu and/or Au and has better corrosion resistance than the reflective film 16.

In a top-view, the p-side electrode 17 is provided inside the region where the insulating film 13 is provided. In other words, the insulating film 13 exists in the entire region between the p-side electrode 17 and the p-type semiconductor layer 12p. Therefore, the light that propagates from the semiconductor stacked body 12 toward the p-side electrode 17 side can undergo total internal reflection at the interface between the p-type semiconductor layer 12p and the insulating film 13 due to the refractive index difference between the p-type semiconductor layer 12p and the insulating film 13. As a result, the optical absorption due to the p-side electrode 17 can be suppressed, and the light extraction efficiency can be increased.

In the example shown in FIG. 2, the first opening 15a and the second opening 15b are provided alternately along the first direction d1 on the insulating film 13. The p-side electrode 17 and the light-transmissive conductive film 14 are connected in the second direction d2 in the regions where the first openings 15a are provided, and the connection portions exist discontinuously at a prescribed spacing along the first direction d1. The prescribed spacing is, for example, the width of the second opening 15b in the first direction d1. In the portion where the p-side electrode 17 and the light-transmissive conductive film 14 are not connected, i.e., the region where the second opening 15b is provided, the current is not diffused in the second direction d2, and the flow of the current is limited to the first direction d1. Thereby, the current easily reaches regions distal to the pad portion 17a along the extension portion 17b, and the diffusability of the current improves, while the current concentration in regions proximal to the pad portion 17a can be suppressed.

As the surface area of the opening 15 increases, the surface area of the light-transmissive conductive film 14 decreases commensurately, and the surface area of the region having the high reflectance increases. Therefore, it is favorable for the surface area of the opening 15 on the insulating film 13 to be greater than the surface area of the light-transmissive conductive film 14 on the insulating film 13.

From the perspective of increasing the reflecting region on the insulating film 13, it is favorable for the surface area of the reflective film 16 provided in the opening 15 to be large. For example, it is favorable for the proportion of the surface area of the reflective film 16 to the surface area of the opening 15 to be 70% or more, and more favorable to be 80% or more. By setting the proportion of the surface area of the reflective film 16 to the surface area of the opening 15 to 70% or more, the reflecting region due to the reflective film 16 can be increased, and the light extraction efficiency can be increased. The total area of the second opening 15b in the opening 15 can be set to be greater than the total area of the first opening 15a in the opening 15 to increase the surface area of the reflective film 16 in the opening 15.

Figure 10:
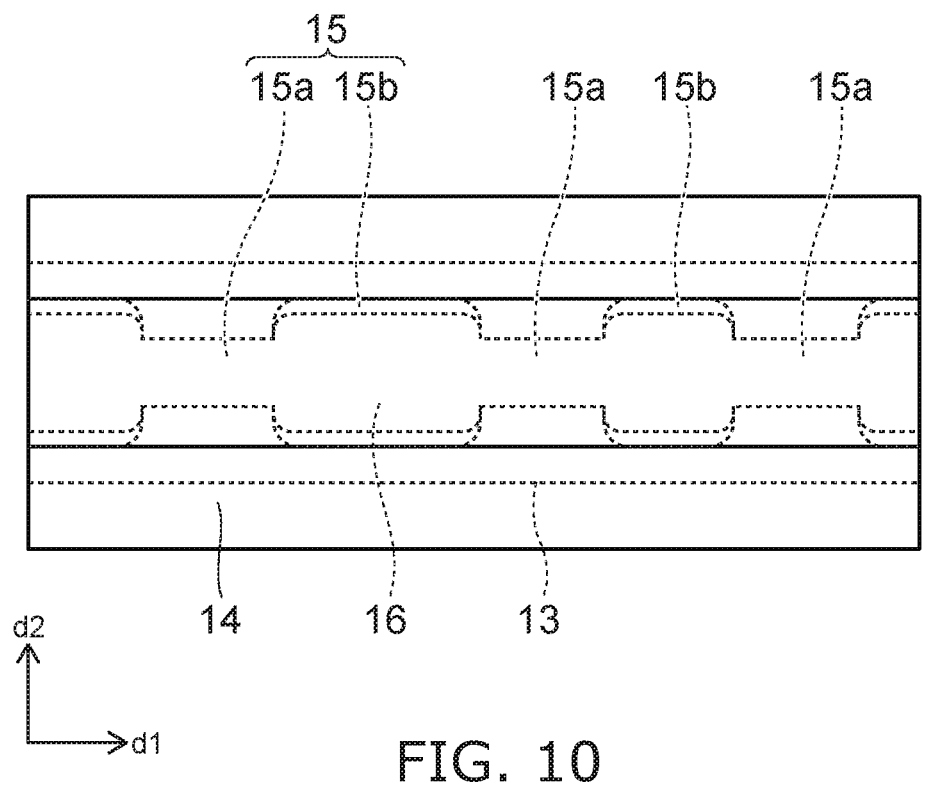
FIG. 10 is an enlarged schematic top view of a portion of a light-emitting element of another embodiment of the invention where an extension portion of a p-side electrode is disposed.

FIG. 10 is a schematic top view showing another arrangement pattern of the components shown in FIG. 2. The first opening 15a and the second opening 15b are provided alternately along the first direction d1 on the insulating film 13, and the connection portions where the p-side electrode 17 and the light-transmissive conductive film 14 are connected exist discontinuously at different spacing along the first direction d1. For example, the spacing can decrease from the pad portion 17a of the p-side electrode 17 toward the tip side of the extension portion 17b of the p-side electrode 17. Thereby, the concentration of the current at the pad portion 17a side of the p-side electrode 17 can be suppressed, and the current can be diffused more easily to the tip side of the extension portion 17b of the p-side electrode 17.

Figure 11:
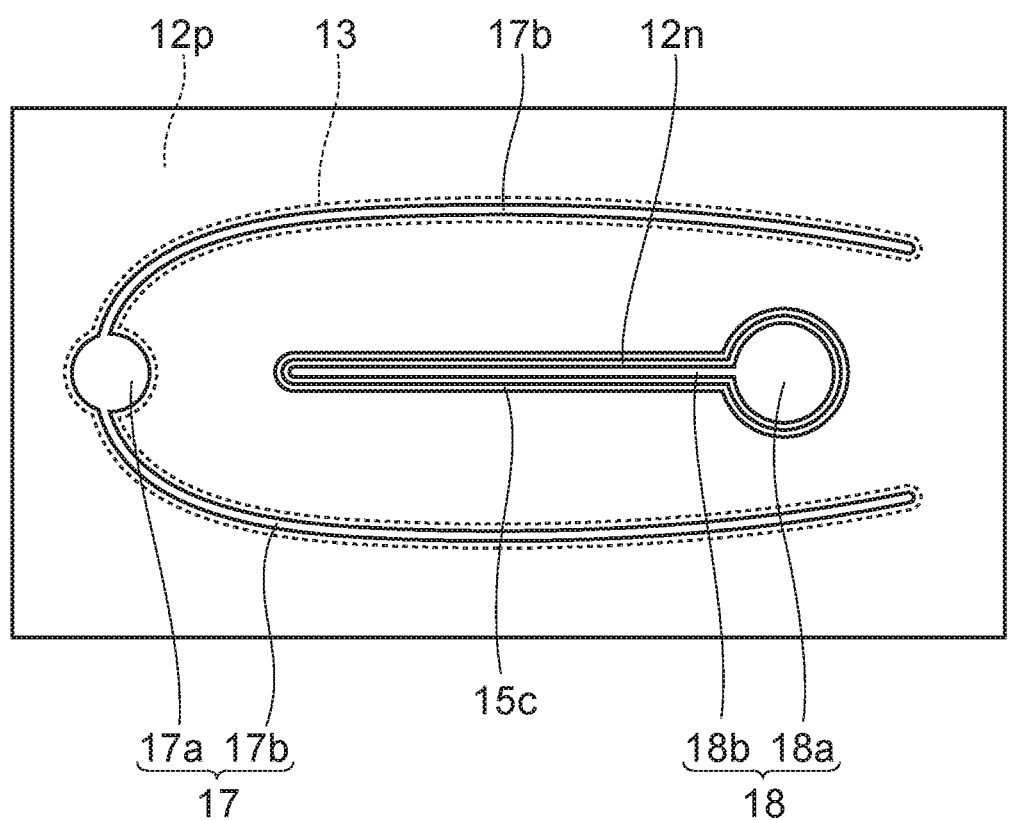
FIG. 11 is a schematic top view showing another electrode pattern of the light-emitting element shown in FIG. 1A.

FIG. 11 is a schematic top view showing another electrode pattern of the light-emitting element shown in FIG. 1A. In the other electrode pattern shown in FIG. 11, the extension portion 17b of the p-side electrode 17 is provided in a curved configuration and does not include a portion formed in a straight-line configuration. By applying the embodiment described above to such an extension portion 17b provided to be curved from the pad portion 17a, the light extraction efficiency of the light-emitting element can be increased similarly to the embodiment described above. Here, the extension portion 17b of the p-side electrode 17 extending in the first direction corresponds to the curved portion of the electrode pattern of FIG. 11.

Certain embodiments of the present disclosure have been described with reference to specific examples. However, the present disclosure is not limited to these specific examples. Based on the above-described embodiments of the present disclosure, all embodiments that can be implemented with appropriately design modification by one skilled in the art are also within the scope of the present disclosure as long as the gist of the present disclosure is included. One skilled in the art can conceive various modifications within the scope of the spirit of the present disclosure, and such modifications fall within the scope of the present disclosure.

What is claimed is:

1. A light-emitting element comprising:
   a semiconductor stacked body comprising an n-type semiconductor layer, a light-emitting layer located on the n-type semiconductor layer, and a p-type semiconductor layer located on the light-emitting layer;
   an insulating film located on the p-type semiconductor layer;
   a p-side electrode located on the insulating film, the p-side electrode comprising a pad portion and an extension portion, the extension portion being continuous with the pad portion in a first direction;
   a light-transmissive conductive film located on the p-type semiconductor layer and on the insulating film, the light-transmissive conductive film having an opening that is continuous along the extension portion of the p-side electrode on the insulating film; and
   a reflective film located between the insulating film and the p-side electrode in the opening of the light-transmissive conductive film, wherein:
   the opening of the light-transmissive conductive film includes a first opening and a second opening,
   a width of the first opening is less than a width of the second opening in a second direction orthogonal to the first direction, a width of the extension portion of the p-side electrode is less than the width of the second opening in the second direction, in the second direction, the light-transmissive conductive film is electrically connected to the extension portion of the p-side electrode at a portion adjacent to a region where the first opening is located.

2. The light-emitting element according to claim 1, wherein, in the second direction, a width of the reflective film located in the second opening is greater than a width of the reflective film located in the first opening.

3. The light-emitting element according to claim 1, wherein, in a top-view, the p-side electrode is located inside a region where the insulating film is located.

4. The light-emitting element according to claim 2, wherein, in a top-view, the p-side electrode is located inside a region where the insulating film is located.

5. The light-emitting element according to claim 1, wherein, in the second direction, the extension portion of the p-side electrode is electrically connected to the light-transmissive conductive film at portions adjacent to two sides of the region where the first opening is located.

6. The light-emitting element according to claim 2, wherein, in the second direction, the extension portion of the p-side electrode is electrically connected to the light-transmissive conductive film at portions adjacent to two sides of the region where the first opening is located.

7. The light-emitting element according to claim 3, wherein, in the second direction, the extension portion of the p-side electrode is electrically connected to the light-transmissive conductive film at portions adjacent to two sides of the region where the first opening is located.

8. The light-emitting element according to claim 1, wherein the p-side electrode covers an upper surface and a side surface of the reflective film.

9. The light-emitting element according to claim 2, wherein the p-side electrode covers an upper surface and a side surface of the reflective film.

10. The light-emitting element according to claim 3, wherein the p-side electrode covers an upper surface and a side surface of the reflective film.

11. The light-emitting element according to claim 1, wherein the first opening and the second opening are located alternately along the first direction.

12. The light-emitting element according to claim 2, wherein the first opening and the second opening are located alternately along the first direction.

13. The light-emitting element according to claim 3, wherein the first opening and the second opening are located alternately along the first direction.

14. The light-emitting element according to claim 1, wherein the extension portion of the p-side electrode and the light-transmissive conductive film located on the insulating film where the second opening is located are not in contact in the second direction.

15. The light-emitting element according to claim 2, wherein the extension portion of the p-side electrode and the light-transmissive conductive film located on the insulating film where the second opening is located are not in contact in the second direction.

16. The light-emitting element according to claim 3, wherein the extension portion of the p-side electrode and the light-transmissive conductive film located on the insulating film where the second opening is located are not in contact in the second direction.

17. The light-emitting element according to claim 1, wherein the light-transmissive conductive film is made of ITO.

18. The light-emitting element according to claim 2, wherein the light-transmissive conductive film is made of ITO.

19. The light-emitting element according to claim 17, wherein a thickness of the light-transmissive conductive film is not less than 10 nm and not more than 200 nm.

20. The light-emitting element according to claim 18, wherein a thickness of the light-transmissive conductive film is not less than 10 nm and not more than 200 nm.

\* \* \* \* \*